United States Patent
Hirata et al.

(10) Patent No.: US 11,424,049 B2
(45) Date of Patent: Aug. 23, 2022

(54) SPHERICAL SILVER POWDER AND METHOD FOR PRODUCING SAME

(71) Applicant: DOWA ELECTRONICS MATERIALS CO., LTD., Tokyo (JP)

(72) Inventors: Koji Hirata, Saitama (JP); Noriaki Nogami, Saitama (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 0 days.

(21) Appl. No.: 14/377,985

(22) PCT Filed: Feb. 12, 2013

(86) PCT No.: PCT/JP2013/053785
§ 371 (c)(1),
(2) Date: Aug. 11, 2014

(87) PCT Pub. No.: WO2013/122244
PCT Pub. Date: Aug. 22, 2013

(65) Prior Publication Data
US 2015/0034883 A1     Feb. 5, 2015

(30) Foreign Application Priority Data

Feb. 13, 2012  (JP) .............................. JP2012-028315
Nov. 14, 2012  (JP) .............................. JP2012-250271

(51) Int. Cl.
*H01B 1/02*       (2006.01)
*H01B 1/22*       (2006.01)
(Continued)

(52) U.S. Cl.
CPC ............. *H01B 1/22* (2013.01); *B22F 1/0003* (2013.01); *B22F 1/0549* (2022.01); *B22F 1/065* (2022.01);
(Continued)

(58) Field of Classification Search
CPC .... H01B 1/02; H01B 1/16; H01B 1/22; B22F 1/0003; B22F 1/0014; B22F 1/0048;
(Continued)

(56) References Cited

U.S. PATENT DOCUMENTS 4,582,534 A * 4/1986 Torobin ................ B22F 1/0051
                                                     428/570
4,637,990 A * 1/1987 Torobin .................... B01J 13/04
                                                      502/10
(Continued)

FOREIGN PATENT DOCUMENTS

JP        8176620 A        7/1996
JP     2001003101 A *      1/2001
(Continued)

OTHER PUBLICATIONS

English machine translation of JP 2009-046708 A.*
(Continued)

*Primary Examiner* — Matthew R Diaz
(74) *Attorney, Agent, or Firm* — Bachman & LaPointe, P.C.

(57) ABSTRACT

While a water reaction system containing silver ions is irradiated with ultrasonic waves to cause cavitation therein, a reducing agent containing solution, which contains an aldehyde as a reducing agent, is mixed with the water reaction system to deposit silver particles, the solid-liquid separation of which is carried out, and thereafter, the separated silver particles are washed and dried to produce a spherical silver powder which has a closed cavity in each particle thereof.

10 Claims, 2 Drawing Sheets

(51) Int. Cl.
*B22F 1/00* (2022.01)
*B22F 1/065* (2022.01)
*B22F 9/24* (2006.01)
*B22F 1/0655* (2022.01)
*B22F 1/054* (2022.01)

(52) U.S. Cl.
CPC .............. *B22F 1/0655* (2022.01); *B22F 9/24* (2013.01); *H01B 1/02* (2013.01); *B22F 2202/01* (2013.01); *B22F 2202/11* (2013.01); *B22F 2301/255* (2013.01)

(58) Field of Classification Search
CPC .... B22F 1/0051; B22F 1/0018; B22F 1/0022; B22F 2001/0029; B22F 2301/255; B22F 1/054; B22F 1/0549; B22F 1/06; B22F 1/065; B22F 1/0655; B22F 1/08; C08K 9/02; C08K 2003/0806; C08K 2201/001; C08K 2201/003; C08K 2201/011; C09J 9/02
USPC ......................................................... 252/514
See application file for complete search history.

(56) References Cited

U.S. PATENT DOCUMENTS

| | | | | |
|---|---|---|---|---|
| 4,793,980 | A * | 12/1988 | Torobin | B01J 13/04 208/112 |
| 4,917,857 | A * | 4/1990 | Jaeckel | B01J 35/08 264/45.3 |
| 5,904,978 | A * | 5/1999 | Hanrahan | C08K 3/0008 174/11 OF |
| 5,945,158 | A * | 8/1999 | Djokic | B22F 1/025 427/216 |
| 6,828,026 | B2 * | 12/2004 | Bretschneider | B22F 1/0051 428/403 |
| 6,835,331 | B2 * | 12/2004 | Fujiki | C08G 65/007 252/512 |
| 6,902,688 | B2 * | 6/2005 | Narayan | C08K 9/02 252/512 |
| 6,991,751 | B2 * | 1/2006 | Fukushima | C09J 9/02 252/512 |
| 7,507,477 | B2 * | 3/2009 | Kubota | B22F 1/025 427/212 |
| 7,648,557 | B2 * | 1/2010 | Irizarry-Rivera | B22F 1/0048 75/371 |
| 7,776,255 | B1 * | 8/2010 | Wedding | B22F 1/0051 419/29 |
| 2010/0221545 | A1 * | 9/2010 | Abe | C09J 9/02 428/406 |
| 2010/0276645 | A1 * | 11/2010 | Aspin | C09J 9/02 252/513 |

FOREIGN PATENT DOCUMENTS

| | | |
|---|---|---|
| JP | 2001-049309 A | 2/2001 |
| JP | 2001049309 A | 2/2001 |
| JP | 2008-106315 A | 5/2008 |
| JP | 2008106315 A | 5/2008 |
| JP | 2008121051 A * | 5/2008 |
| JP | 2008-221121 A | 9/2008 |
| JP | 2009-046708 A | 3/2009 |
| JP | 2009046708 A | 3/2009 |

OTHER PUBLICATIONS

English machine translation of JP 2008-121051 A.*
English machine translation of Hirasawa et al. JP 2001-003101 A. (Year: 2001).*
Suslick, Kenneth S. and Price, Gareth J., Applications of Ultrasound to Materials Chemistry, Annual Review of Materials Science, vol. 29, 1999, pp. 295-323.
Hsien-Hsueh Lee et al: "Inkjet printing of nanosized silver colloids; Inkjet printing of nanosized silver colloids", Nanotechnology, IOP, Bristol, GB, vol. 16, No. 10, Sep. 2, 2005, pp. 2436-2441, XP020090802, ISSN: 0957-4484, DOI: 10.1088/0957-4484/16/10/074.
Christian Kind et al: "Microemulsion-based synthesis of nanoscaled silver hollow spheres and direct comparison with massive particles of similar size", Nanoscale, vol. 2, No. 10, Aug. 6, 2010, p. 2223, XP055225477, United Kingdom, ISSN: 2040-3364, DOI:10.1039/c0nr00291g.
Dan V. Goia et al: "Preparation of monodispersed metal particles", New Journal of Chemistry, vol. 22, No. 11, Jan. 1, 1998, pp. 1203-1215, XP055192352, ISSN: 1144-0546, DOI: 10.1039/a709236i.
Okitsu K et al: "Formation of noble metal particles by ultrasonic irradiation", Ultrasonics: Sonochemistry, Butterworth-Heinemann, GB, vol. 3, No. 3, Nov. 1, 1996, pp. S249-S251, XP004063062, ISSN: 1350-4177, DOI: 10.1016/S1350-4177(96)00033-8.
Supplementary European Search Report for Application No. EP 13 749 707.9 dated Nov. 4, 2015.

* cited by examiner

SPHERICAL SILVER POWDER AND METHOD FOR PRODUCING SAME

TECHNICAL FIELD

The present invention relates generally to a spherical silver powder and a method for producing the same. More specifically, the invention relates to a spherical silver powder for a conductive paste for use in electronic parts, such as internal electrodes of laminated capacitors, conductive patterns of circuit boards, and electrodes and circuits of substrates for plasma display panels and solar cells, and a method for producing the same.

BACKGROUND ART

As a conventional method for forming internal electrodes of laminated capacitors, conductive patterns of circuit boards, electrodes and circuits of substrates for solar cells and plasma display panels (PDPs), there is widely used a method for forming a cermet type conductive paste, which is produced by kneading a mixture obtained by adding a silver powder and a glass frit to an organic vehicle, in a predetermined pattern on a substrate, and thereafter, heating the paste at a temperature of not lower than 500° C. to remove organic components to sinter silver particles with each other to form a conductive film.

It is required that a silver powder for a conductive paste for use in such a method has a reasonably small particle size and a reasonably narrow range of the particle size in order to form small electronic parts and conductive patterns having a high density and fine lines.

As a method for producing such a silver powder for a conductive paste, there is known a wet reducing method for adding a reducing agent to a water reaction system containing silver ions to deposit a spherical silver powder by reduction (see, e.g., Japanese Patent Laid-Open No. 8-176620).

However, if a spherical silver powder having a particle size, which is substantially equal to that of a spherical silver powder produced by a conventional wet reducing method, is used for forming a cermet type conductive paste, even if the paste is heated at a temperature of about 600° C., there are some cases where it is not possible to sufficiently sinter silver particles with each other, so that it is not possible to form a good conductive film.

DISCLOSURE OF THE INVENTION

It is therefore an object of the present invention to eliminate the aforementioned conventional problems and to provide a spherical silver powder, which has a particle size being substantially equal to that of a spherical silver powder produced by a conventional wet reducing method and which is capable of being fired at a lower temperature, and a method for producing the same.

In order to accomplish the aforementioned and other objects, the inventors have diligently studied and found that it is possible to produce a spherical silver powder, which has a particle size being substantially equal to that of a spherical silver powder produced by a conventional wet reducing method and which is capable of being fired at a lower temperature, if silver particles are deposited by reduction by mixing a reducing agent containing solution, which contains an aldehyde as a reducing agent, with a water reaction system containing silver ions while causing cavitation in the water reaction system. Thus, the inventors have made the present invention.

According to the present invention, there is provided a method for producing a spherical silver powder, the method comprising the steps of: preparing a water reaction system containing silver ions; preparing a reducing agent containing solution which contains an aldehyde as a reducing agent; and depositing silver particles by reduction by mixing the reducing agent containing solution with the water reaction system while causing cavitation in the water reaction system. In this method for producing a spherical silver powder, the cavitation is caused by irradiating the water reaction system containing silver ions with ultrasonic waves. The water reaction system containing silver ions is preferably an aqueous solution containing a silver ammonia complex. The reducing agent containing solution is preferably a solution containing formaldehyde or acetaldehyde. The method may further comprise steps of carrying out the solid-liquid separation of the silver particles deposited by reduction; washing the separated silver particles; and drying the washed silver particles at a temperature of not higher than 100° C. The spherical silver powder preferably has a closed cavity in each particle thereof.

According to the present invention, there is provided a spherical silver powder which has a closed cavity in each particle thereof. This spherical silver powder preferably has a mean particle size $D_{50}$ of 0.1 to 10 μm when the particle size is obtained by a laser diffraction method. The spherical silver powder preferably has a true specific gravity of not greater than 9.8 g/cm³. The content of each of impurities, except for carbon, nitrogen, oxygen and hydrogen, contained in the spherical silver powder is preferably less than 100 ppm.

According to the present invention, there is provided a conductive paste using the above-described spherical silver powder as a conductor.

According to the present invention, it is possible to produce a spherical silver powder, which has a particle size being substantially equal to that of a spherical silver powder produced by a conventional wet reducing method and which is capable of being fired at a lower temperature, by depositing silver particles by reduction by mixing a reducing agent containing solution, which contains an aldehyde as a reducing agent, with a water reaction system containing silver ions while causing cavitation in the water reaction system.

BEST MODE FOR CARRYING OUT THE INVENTION

Figure 1:
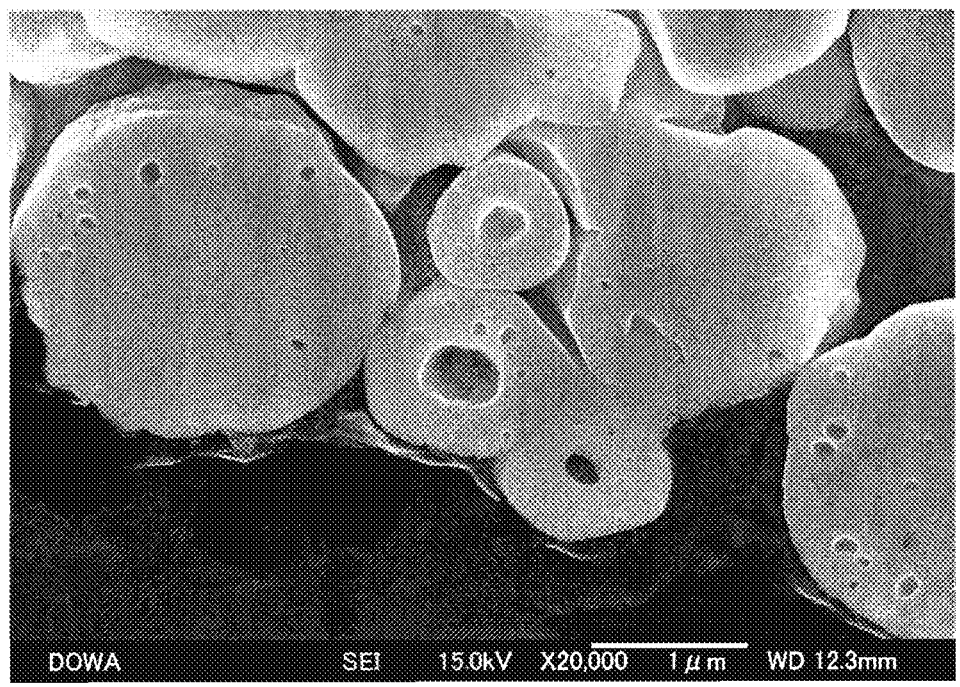
FIG. 1 is a field emission-scanning electron micrograph (FE-SEM image) of a cross section of a spherical silver powder obtained in Example 1.

In a preferred embodiment of a method for producing a spherical silver powder according to the present invention, silver particles are deposited by reduction by mixing a reducing agent containing solution, which contains an aldehyde as a reducing agent, with a water reaction system containing silver ions while causing cavitation in the water reaction system.

The cavitation is a physical phenomenon in which the generation and extinction of bubbles occur in a short time by a local pressure difference caused in a liquid. The cavitation can be produced by the irradiation with ultrasonic waves, a homogenizer for emulsion treatment or the like. In order to cause cavitation in the whole water reaction system containing silver ions, the cavitation is preferably produced by irradiating the water reaction system containing silver ions with ultrasonic waves. The oscillating frequency of the irradiated ultrasonic waves may be an oscillating frequency capable of causing cavitation, and is preferably in the range of from 28 kHz to 40 kHz. The output of the ultrasonic waves may be set in accordance with the amount of liquid used for causing the deposition reaction of silver particles by reduction. The irradiation with the ultrasonic waves may be carried out when the reducing agent containing solution is added for depositing the silver particles by reduction, or it may be carried out before or after the reducing agent containing solution is added for depositing the silver particles by reduction.

As the water reaction system containing silver ions, an aqueous solution or slurry containing silver nitrate, a silver salt complex or a silver intermediate may be used. The aqueous solution containing a silver salt complex may be produced by adding aqueous ammonia or an ammonia salt to an aqueous silver nitrate solution or a suspension of silver oxide. Among them, an aqueous solution of silver ammine complex obtained by adding aqueous ammonia to an aqueous silver nitrate solution is preferably used in order to produce a silver powder having an appropriate particle size and a spherical shape. The coordination number of ammonia in the silver ammine complex is 2, so that 2 moles or more of ammonia per 1 mole of silver is added. If the amount of ammonia to be added is too large, the complex is too stable, so that it is difficult to proceed reduction. Therefore, the amount of ammonia to be added is preferably not larger than 8 moles per 1 mole of silver. Furthermore, if adjustment is carried out by increasing the amount of ammonia to be added or the like, even if the amount of ammonia to be added exceeds 8 moles, it is possible to obtain a spherical silver powder having an appropriate particle size.

As the reducing agent, a compound having an aldehyde group may be used, and formaldehyde or acetaldehyde is preferably used. The aldehyde may be used alone, or aldehyde compounds may be combined to be used. Alternatively, a mixture of water or alcohol with an aldehyde, such as formalin, may be used. If the cavitation is caused when a reducing agent containing solution, which contains an aldehyde as the reducing agent, is added to deposit silver particles by reduction, it is possible to obtain a spherical silver powder having a closed cavity in the interior of each particle thereof. The amount of the reducing agent to be added may be an excessive amount with respect to the water reaction system containing silver ions. In order to decrease the amount of silver ions remaining in the water reaction system containing silver ions to suppress the loss of silver being a noble metal, the amount of the reducing agent required to cause the amount of unreduced silver ions to be 10 ppm or less may be added.

To the water reaction system containing silver ions, a pH adjusting agent may be added. As the pH adjusting agent, a general acid or base may be used. For example, nitric acid, sodium hydroxide or the like may be used.

To the water reaction system containing silver ions, a surface treating agent may be added. As the surface treating agent, there may be used any one or more of fatty acids, fatty acid salts, surface active agents, organometallic compounds, chelating agents, high-polymer dispersing agents and so forth. Examples of fatty acids include propionic acid, caprylic acid, lauric acid, myristic acid, palmitic acid, stearic acid, behenic acid, acrylic acid, oleic acid, linolic acid, and arachidonic acid. Examples of fatty acid salts include salts formed by fatty acids and metals, such as lithium, sodium, potassium, barium, magnesium, calcium, aluminum, iron, cobalt, manganese, lead, zinc, tin, strontium, zirconium, silver or copper. Examples of surface active agents include: anionic surface active agents, such as alkyl benzene sulfonates and polyoxyethylene alkyl ether phosphates; cationic surface active agents, such as aliphatic quaternary ammonium salts; amphoteric surface active agents, such as imidazoliniumbetaine; and nonionic surface active agents, such as polyoxyethylene alkyl ethers and polyoxyethylene fatty acid esters. Examples of organometallic compounds include acetylacetone tributoxyzirconium, magnesium citrate, diethylzinc, dibutyltin oxide, dimethylzinc, tetra-n-butoxyzirconium, triethyl indium, triethyl gallium, trimethyl indium, trimethyl gallium, monobutyl tin oxide, tetraisocyanate silane, tetramethyl silane, tetramethoxy silane, polymethoxy siloxane, monomethyl triisocyanate silane, silane coupling agent, titanate coupling agents, and aluminum coupling agents. Examples of chelating agents include imidazole, oxazole, triazole, selenazole, pyrazole, isoxazole, isothiazole, 1H-1,2,3-triazole, 2H-1,2,3-triazole, 1H-1,2,4-triazole, 4H-1,2,4-triazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1H-1,2,3,4-tetrazole, 1,2,3,4-oxatriazole, 1,2,3,4-thiatriazole, 2H-1,2,3,4-tetrazole, 1,2,3,5-oxatriazole, 1,2,3,5-thiatriazole, indazole, benzoimidazole, benzotriazole and salts thereof, and oxalic acid, succinic acid, malonic acid, glutaric acid, adipic acid, pimelic acid, suberic acid, azelaic acid, sebacic acid, didodecanoic acid, maleic acid, fumaric acid, phthalic acid, isophthalic acid, terephthalic acid, glycolic acid, lactic acid, hydroxy butyric acid, glyceric acid, tartaric acid, malic acid, tartronic acid, hydracrylic acid, mandelic acid, citric acid and ascorbic acid. Examples of high-polymer dispersing agents include peptide, gelatin, collagen peptide, albumin, gum arabic, protarbic acid and lysalbic acid. These surface active agents may be used alone, or they may be combined to be used.

After the solid-liquid separation of the silver containing slurry obtained by depositing the silver particles by reduction is carried out, the silver particles are washed with water. Thus, there is obtained a solid cake which contains 1 to 200 wt % of water with respect to silver and which is hardly fluid. In order to rapidly dry the cake, water in the cake may be replaced with a lower alcohol or the like. It is possible to obtain a dried silver powder by drying the cake by means of a drier, such as a forced circulation air drier, a vacuum drier or a flash drier (pneumatic conveying drier). The temperature of drying is preferably not higher than 100° C. in order to maintain a closed cavity in the interior of each particle of the silver powder.

The obtained silver powder may be subjected to a dry-crushing and/or classification process. In place of the crushing, the silver powder may be subjected to a surface smoothing process for smoothing the irregularities and angular portions on the surface of the particles of the silver powder by mechanically causing the particles of the silver powder to collide with each other by putting the silver powder into an apparatus capable of mechanically fluidizing particles. After the crushing or surface smoothing process is carried out, a classification process may be carried out. The drying, crushing and classification processes may be carried out by an integrated apparatus capable of carrying out the drying, crushing and classification processes (DRY MASTER produced by Hosokawa Micron Corporation, Micron Drier or the like).

By the above-described method for producing a spherical silver powder, it is possible to produce a spherical silver powder having a plurality of closed cavities (closed pores) in particles thereof. The process for forming a conductive film by firing a cermet type conductive paste using a silver powder, generally comprises: (1) Evaporation of Diluent Solvent, (2) Combustion of Organic Components (surface treating agent and resin), (3) Softening of Glass Frit serving as Sintering Additive, and (4) Liquid-Phase Sintering of Silver Particles. In order to form the wiring of the conductive film at a lower temperature, it is required to lower the temperature for the above-described (2) through (4). When a usual spherical silver powder is used, the combustion of organic components in the above-described (2) occurs only on the surface of the silver particles, so that the influence of the combustion of organic components on the combustion of the silver particles is limited. However, when a spherical silver powder having cavities in particles thereof is used, it is considered that the expansion of substances in the cavities and the energy of the combustion thereof in addition to the combustion of the organic components on the surface of the silver particles advantageously contribute to the combustion of the silver particles. On the other hand, in the case of a spherical silver powder wherein the cavities in particles thereof are open to the outside, the extinction of the substances in the particles is caused during the washing and drying in the production of the spherical silver powder. Therefore, the expansion and combustion of the substances in the cavities are not caused during combustion, substantially similar to those in the usual spherical silver powder. Furthermore, as a method for producing a silver powder having cavities in particles thereof, there is considered a method for using particles of a metal, which is loss nobler than silver, as particles of a base material to deposit silver on the surface of the particles of the metal by a substitution reaction to dissolve and remove the particles of the base material. However, in this method, if the cavities in particles thereof are closed cavities, the metal component of the particles of the base material remains. For that reason, there is the possibility of deteriorating the conductivity of the silver powder and the reliability of the silver powder due to oxidation, so that it is required to cause the cavities in particles thereof to be cavities which are open to the outside.

In order to prevent the rise of electric resistance and the deterioration of reliability due to oxidation in the spherical silver powder having closed cavities in the particles thereof, the content of each of the impurity elements, such as transition metals, alkali earth metals, alkali metals, aluminum and magnesium, as impurities (contained therein by catching the reaction mother liquor during reduction) is preferably less than 100 ppm.

The true specific gravity of the spherical silver powder having the closed cavities in particles thereof is preferably not greater than 9.8 g/cm$^3$. Since the true specific gravity of bulk silver is 10.5 g/cm$^3$, the true specific gravity of not greater than 9.8 g/cm$^3$ is lower than that of bulk silver by 7% or more. If the true specific gravity is greater than 9.8 g/cm$^3$, the size or number of the cavities is too small, or the cavities are open to the outside, so that there are some cases where the effect of promoting sintering by the expansion of substances in the particles thereof and the combustion of the substances may be insufficient.

The mean particle size $D_{50}$ of the spherical silver powder having the closed cavities in particles thereof is preferably 0.1 to 10 μm when the particle size is obtained by a laser diffraction method. In order to use the spherical silver powder for forming a thinner conductive film, the mean particle size is more preferably not greater than 5 μm. On the other hand, if the particle size of the spherical silver powder is too small, the specific surface area thereof increases. For that reason, if such a spherical silver powder is used for forming a conductive paste, the viscosity thereof increase, and if such a spherical silver powder is used for forming a photosensitive paste, the transmission of ultraviolet rays is easy to be insufficient. Therefore, the mean particle size of the spherical silver powder is preferably not smaller than 0.1 μm.

The above-described spherical silver powder may be used as a conductor for producing a conductive paste. For example, a conductive paste may be produced by mixing the above-described spherical silver powder with a resin. Furthermore, examples of the resin include epoxy resins, acrylic resins, polyester resins, polyimide resins, polyurethane resins, phenoxy resins, silicone resins, and ethyl cellulose. These resins may be used alone, or two or more of these resins may be combined to be used. The conductive paste may be printed on a substrate by the screen printing, offset printing, photolithography method, or the like. In the case of the screen printing, the viscosity of the conductive paste is preferably 30 to 100 Pa·s at 25° C. If the viscosity of the conductive paste is less than 30 Pa·s, "bleeding" may occur during the printing, and if the viscosity of the conductive paste exceeds 100 Pa·s, the lack of print uniformity may be caused.

Examples of a spherical silver powder and a method for producing the same according to the present invention will be described below in detail.

EXAMPLE 1

First, 753 g of an aqueous silver nitrate solution containing 8.63 g of silver was distributed into a 1 L beaker. Then, the beaker was put in an ultrasonic washing machine (Cleaner USD-4R produced by AS ONE CORPORATION, Output 160 W) containing water having a temperature of 35° C. therein. Then, the solution in the beaker was started to be irradiated with ultrasonic waves at an oscillating frequency of 40 kHz and to be stirred.

Then, 29.1 g of an aqueous solution containing 28 wt % of ammonia (the equivalent thereof corresponding to 3.0 with respect to silver) was added to the aqueous silver nitrate solution in the beaker to form a silver ammine complex. After 30 seconds from the addition of the aqueous ammonia, 0.48 g of an aqueous solution containing 20 wt % of sodium hydroxide was added thereto. After 20 minutes from the addition of the aqueous ammonia, 48.7 g of an aqueous solution containing 27.4 wt % of formaldehyde (the equivalent thereof corresponding to 11.1 with respect to silver) prepared by diluting formalin with pure water was added thereto. After 30 seconds from the addition of the aqueous formaldehyde solution, 0.86 g of an ethanol solution containing 1.2 wt % of stearic acid was added thereto to form a slurry containing silver particles.

Then, after the irradiation with ultrasonic waves was completed, the slurry containing silver particles was filtrated and washed with water. The cake thus obtained was dried at 75° C. for 10 hours by means of a vacuum drier. The silver powder thus dried was crushed for 30 seconds by means of a coffee mill to obtain a spherical silver powder.

With respect to the spherical silver powder thus obtained, the particle size distribution based on the laser diffraction method, BET specific surface area and true specific gravity thereof were measured, and the cross section of particles thereof was observed. In addition, the contents of impurity elements, silver and organic components (carbon, nitrogen, oxygen and hydrogen) were obtained.

The particle size distribution based on the laser diffraction method was measured by means of a micro-track particle size distribution measuring apparatus (9320HAR (X-100) produced by Haneywell-Nikkiso Co., Ltd.) after dispersing 0.3 g of the spherical silver powder, which was put in 30 mL of isopropyl alcohol, for 5 minutes by an ultrasonic cleaning apparatus having an output of 50 W. As a result, the particle size distribution was $D_{10}$=1.6 μm, $D_{50}$=3.0 μm and $D_{90}$=5.3 μm.

The BET specific surface area was measured, by the single point BET method based on adsorption of nitrogen, using a specific surface area measuring apparatus (Monosorb produced by Quanta Chrome Ltd.) after the spherical silver powder was degassed at 60° C. for 10 minutes. As a result, the BET specific surface area was 0.35 $m^2$/g.

The true specific gravity was measured using 10 g of the spherical silver powder, isopropyl alcohol serving as a liquid for immersion, and a pycnometer having a volume of 50 mL. As a result, the true specific gravity was 9.6 g/$cm^3$, so that it was conformed that the true specific gravity was decreased by 9% with respect to the true specific gravity of bulk silver being 10.5 g/$cm^3$.

The observation of the cross section of particles was carried out by observing the cross section of the spherical silver powder by a field emission scanning microscope (FE-SEM) (JSM-6700F produced by JEOL Ltd.), the cross section of the spherical silver powder being obtained by cutting the silver powder by a focused ion beam (FIB) system (JEM-9310FIB produced by JEOL Ltd.). As a result, it was confirmed that closed cavities exist in the particles of the spherical silver powder as shown in the FE-SEM image of FIG. 1. The area of all particles of the spherical silver powder on the FE-SEM image was 13.7 $μm^2$, and the area of particles having the closed cavities was 0.56 $μm^2$, so that the percentage of the area of particles having the closed cavities with respect to the area of all particles of the spherical silver powder was 4.1%. Considering that it is not always that the cross section of the observed particles of the spherical silver powder passes through the center of each of the particles, it is considered that the cavities exist in most of the particles of the spherical silver powder. It was also confirmed that the mean cavity size evaluated from the FE-SEM image was 0.07 μm corresponding to 2.4% with respect to the mean particle size $D_{50}$, the evaluated mean cavity size being a sufficient cavity size.

The content of each of the impurity elements in the spherical silver powder was obtained by a quantitative analysis using an inductively coupled plasma (ICP) analyzer (iCAP 6300 produced by Thermo Scientific, Inc.) after the following procedures were carried out. That is, after 1.0 g of the spherical silver powder was dissolved in 10 mL of (1+1) nitric acid, 5 mL of (1+1) hydrochloric acid was added thereto to deposit silver chloride. Then, after the solution containing the deposited silver chloride was filtrated to obtain a filtrate, pure water was added to the obtained filtrate to cause the filtrate to have a constant volume. Thereafter, the filtrate thus obtained was used for obtaining the content of each of the impurity elements. As a result, it was confirmed that Cr=1 ppm, Mn<1 ppm, Fe=7 ppm, Co<5 ppm, Ni<5 ppm, Cu<1 ppm, Zn<5 ppm, Cd<1 ppm, Pb<5 ppm, Sn<10 ppm, Ca<1 ppm, Mg<1 ppm, S<50 ppm, Zr<1 ppm, Bi<10 ppm, Al<10 ppm, Sr<1 ppm, Ba<1 ppm, Li<100 ppm, Na<100 ppm, K<100 ppm, Rb<100 ppm and Cs<100 ppm, so that the content of each of the impurity elements was less than 100 ppm.

The content of silver in the spherical silver powder was obtained by measuring the weight of dried silver chloride obtained by drying silver chloride obtained by the filtration. As a result, the content of silver was 99.37 wt %.

The content of each of organic components (carbon, nitrogen, oxygen and hydrogen) in the spherical silver powder was obtained as follows. The content of carbon was obtained by determining the quantity of carbon at a heating temperature of 1350° C. by means of a carbon/sulfur analyzer (EMIA-U510 produced by HORIBA, Ltd.). As a result, the content of carbon was 1700 ppm. The content of each of nitrogen, oxygen and hydrogen was obtained by determining the quantity of each of nitrogen, oxygen and hydrogen by means of a nitrogen/oxygen/hydrogen analyzer (ONH836 produced LECO, Ltd.). As a result, the contents of nitrogen, oxygen and hydrogen were 745 ppm, 3020 ppm and 800 ppm, respectively.

Then, after the operation for mixing 83.4 wt % of the spherical silver powder thus obtained, 1.2 wt % of a resin (ethyl cellulose produced by Wako Pure Chemical Industries, Ltd., 100 cps) and 15.4 wt % of a solvent (terpineol produced by Wako Pure Chemical Industries, Ltd.) for 30 seconds was carried out twice by means of a propellerless planetary centrifugal stirring/degassing apparatus (AR250 produced by Thinky Corporation), the mixture thus obtained was caused to pass through a triple roll mill (EXAKT80S produced by Otto-Harmann, Ltd.) at a roll gap of 100 μm to 20 μm to be kneaded to obtain a conductive paste.

Then, the conductive paste thus obtained was printed on each of two 96% alumina substrates at an attack pressure of squeegee of 0.3 MPa by the screen printing using a screen printing machine (produced by Micro-tech Co., Ltd.) so as to form a rectangular film having a size of 8 mm×10 mm, and was dried at 200° C. for 20 minutes by means of an atmospheric circulation type drier. Thereafter, a box furnace was used for heating each of the substrates at 400° C. and 700° C. for 10 minutes, respectively, to prepare a conductive film.

With respect to the conductive film thus obtained, the thickness thereof was obtained by measuring the difference in level between the surface of the conductive film on the alumina substrate and a portion on the alumina substrate, in which the conductive film was not printed, by means of a surface roughness tester (Surfcoder SE-30D produced by Kosaka Laboratory Ltd.), and the surface resistivity thereof was measured by the four-point probe method using a resistivity measuring apparatus (MCP-T410 produced by Mitsubishi Chemical Corporation). Then, the volume resistivity of the conductive film was derived from the surface resistivity and the volume of the conductive film (=Width×Length×Thickness). As a result, the volume resistivity of the conductive film fired at 400° C. was 5.2×$10^{-6}$ Ω·cm, and the volume resistivity of the conductive film fired at 700° C. was 2.6×$10^{-6}$ Ω·cm. Thus, the conductivity in an order of $10^{-6}$ Ω·cm was ensured even if the conductive film was obtained by firing at 400° C.

EXAMPLE 2

First, 753 g of an aqueous silver nitrate solution containing 8.63 g of silver was distributed into a 1 L beaker. Then, the beaker was put in an ultrasonic washing machine (Cleaner USD-4R produced by AS ONE CORPORATION, Output 160 W) containing water having a temperature of 20° C. therein, and the solution in the beaker was started to be stirred.

Then, 26.2 g of an aqueous solution containing 28 wt % of ammonia (the equivalent thereof corresponding to 2.7 with respect to silver) was added to the aqueous silver nitrate solution in the beaker to form a silver ammine complex. After 19 minutes from the addition of the aqueous ammonia, the solution in the beaker was started to be irradiated with ultrasonic waves at an oscillating frequency of 40 kHz. After 1 minute from the irradiation, 54.4 g of an aqueous solution containing 27.4 wt % of formaldehyde (the equivalent thereof corresponding to 12.4 with respect to silver) prepared by diluting formalin with pure water was added thereto. After 15 seconds from the addition of the aqueous formaldehyde solution, 1.06 g of an ethanol solution containing 2.1 wt % of benzotriazole was added thereto to form a slurry containing silver particles.

Then, after the irradiation with ultrasonic waves was completed, the slurry containing silver particles was filtrated and washed with water. The cake thus obtained was dried at 75° C. for 10 hours by means of a vacuum drier. The silver powder thus dried was crushed for 30 seconds by means of a coffee mill to obtain a spherical silver powder.

With respect to the spherical silver powder thus obtained, the particle size distribution based on the laser diffraction method, BET specific surface area and true specific gravity thereof were measured by the same methods as those in Example 1, and the cross section of particles thereof was observed by the same method as that in Example 1. In addition, the contents of impurity elements, silver and organic components (carbon, nitrogen, oxygen and hydrogen) were obtained by the same methods as those in Example 1.

As a result, the particle size distribution was $D_{10}$=1.5 μm, $D_{50}$=2.8 μm and $D_{90}$=4.5 μm, and the BET specific surface area was 0.36 m$^2$/g. The true specific gravity was 9.7 g/cm$^3$, so that it was confirmed that the true specific gravity was decreased by 8% with respect to the true specific gravity of bulk silver being 10.5 g/cm$^3$.

Figure 2:
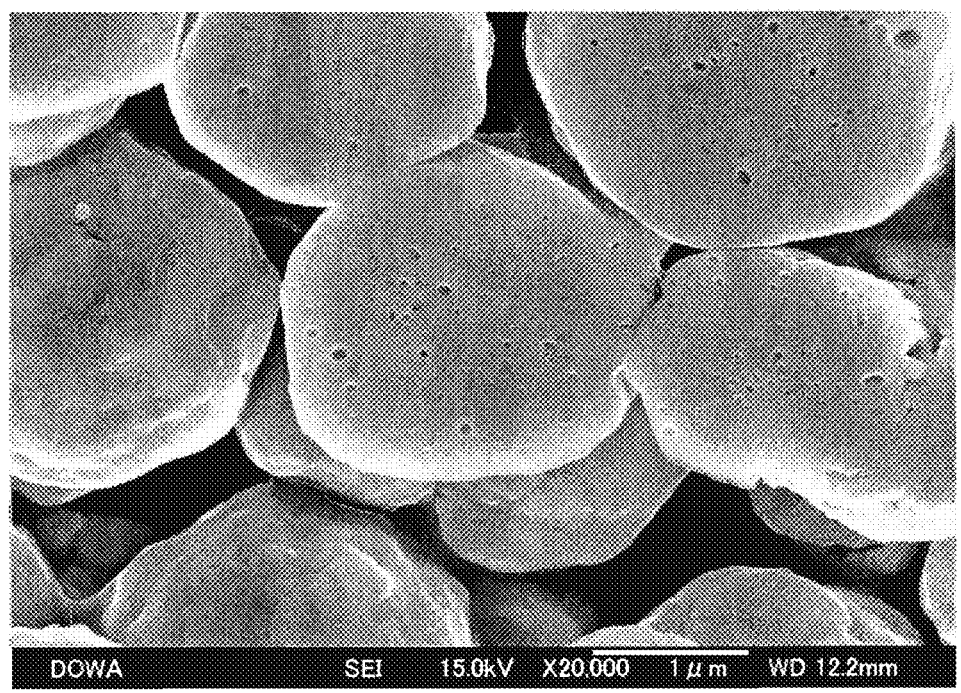
FIG. 2 is an FE-SEM image of a cross section of a spherical silver powder obtained in Example 2.

In the observation of the cross section of the particles of the spherical silver powder, it was confirmed that closed cavities exist in the particles of the spherical silver powder as shown in the FE-SEM image of FIG. 2. The area of all particles of the spherical silver powder on the FE-SEM image was 11.8 μm$^2$, and the area of particles having the closed cavities was 0.34 μm$^2$, so that the percentage of the area of particles having the closed cavities with respect to the area of all particles of the spherical silver powder was 2.9%. Considering that it is not always that the cross section of the observed particles of the spherical silver powder passes through the center of each of the particles, it is considered that the cavities exist in most of the particles of the spherical silver powder. It was also confirmed that the mean cavity size obtained by the FE-SEM image is 0.05 μm which corresponds to 1.7% with respect to the mean particle size $D_{50}$ and which is a sufficient cavity size.

With respect to the content of each of the impurity elements in the spherical silver powder, it was confirmed that Cr=1 ppm, Mn<1 ppm, Fe=6 ppm, Co<5 ppm, Ni<5 ppm, Cu<1 ppm, Zn<5 ppm, Cd<1 ppm, Pb<5 ppm, Sn<10 ppm, Ca<1 ppm, Mg<1 ppm, S<50 ppm, Zr<1 ppm, Bi<10 ppm, Al<10 ppm, Sr<1 ppm, Ba<1 ppm, Li<100 ppm, Na<100 ppm, K<100 ppm, Rb<100 ppm and Cs<100 ppm, so that the content of each of the impurity elements was less than 100 ppm. The content of silver in the spherical silver powder was 99.21 wt %. The contents of carbon, nitrogen, oxygen and hydrogen were 2400 ppm, 1710 ppm, 3360 ppm and 650 ppm, respectively.

The spherical silver powder thus obtained was used for preparing a conductive film from a conductive paste by the same methods as those in Example 1, and the volume resistivity thereof was derived by the same method as that in Example 1. As a result, the volume resistivity of the conductive film fired at 400° C. was 5.7×10$^{-6}$ Ω·cm, and the volume resistivity of the conductive film fired at 700° C. was 2.4×10$^{-6}$ Ω·cm. Thus, the conductivity in an order of 10$^{-6}$ Ω·cm was ensured even if the conductive film was obtained by firing at 400° C.

EXAMPLE 3

First, 688 g of an aqueous silver nitrate solution containing 9.00 g of silver was distributed into a 1 L beaker. Then, the beaker was put in an ultrasonic washing machine (Cleaner USD-4R produced by AS ONE CORPORATION, Output 160 W) containing water having a temperature of 30° C. therein. Then, the solution in the beaker was started to be irradiated with ultrasonic waves at an oscillating frequency of 28 kHz, and to be stirred.

Then, 27.6 g of an aqueous solution containing 28 wt % of ammonia (the equivalent thereof corresponding to 2.5 with respect to silver) was added to the aqueous silver nitrate solution in the beaker to form a silver ammine complex. After 1 minute from the addition of the aqueous ammonia, 2.5 g of an aqueous solution containing 20 wt % of sodium hydroxide was added thereto. After 20 minutes from the addition of the aqueous sodium hydroxide solution, 79.4 g of an aqueous solution containing 27.4 wt % of formaldehyde prepared by diluting formalin with pure water (the equivalent thereof corresponding to 13.0 with respect to silver) was added thereto. After 5 seconds from the addition of the aqueous formaldehyde solution, 2.3 g of an ethanol solution containing 2.5 wt % of stearic acid was added thereto to form a slurry containing silver particles.

Then, after the irradiation with ultrasonic waves was completed, the slurry containing silver particles was filtrated and washed with water. The cake thus obtained was dried at 75° C. for 10 hours by means of a vacuum drier. The silver powder thus dried was crushed for 30 seconds by means of a coffee mill to obtain a spherical silver powder.

With respect to the spherical silver powder thus obtained, the particle size distribution based on the laser diffraction method, BET specific surface area and true specific gravity thereof were measured by the same methods as those in Example 1, and the cross section of particles thereof was observed by the same method as that in Example 1. In addition, the contents of impurity elements, silver and organic components (carbon, nitrogen, oxygen and hydrogen) were obtained by the same methods as those in Example 1.

As a result, the particle size distribution was $D_{10}$=0.7 μm, $D_{50}$=1.3 μm and $D_{90}$=2.3 μm, and the BET specific surface area was 0.77 m$^2$/g. The true specific gravity was 9.3 g/cm$^3$, so that it was confirmed that the true specific gravity was decreased by 11% with respect to the true specific gravity of bulk silver being 10.5 g/cm$^3$.

Figure 3:
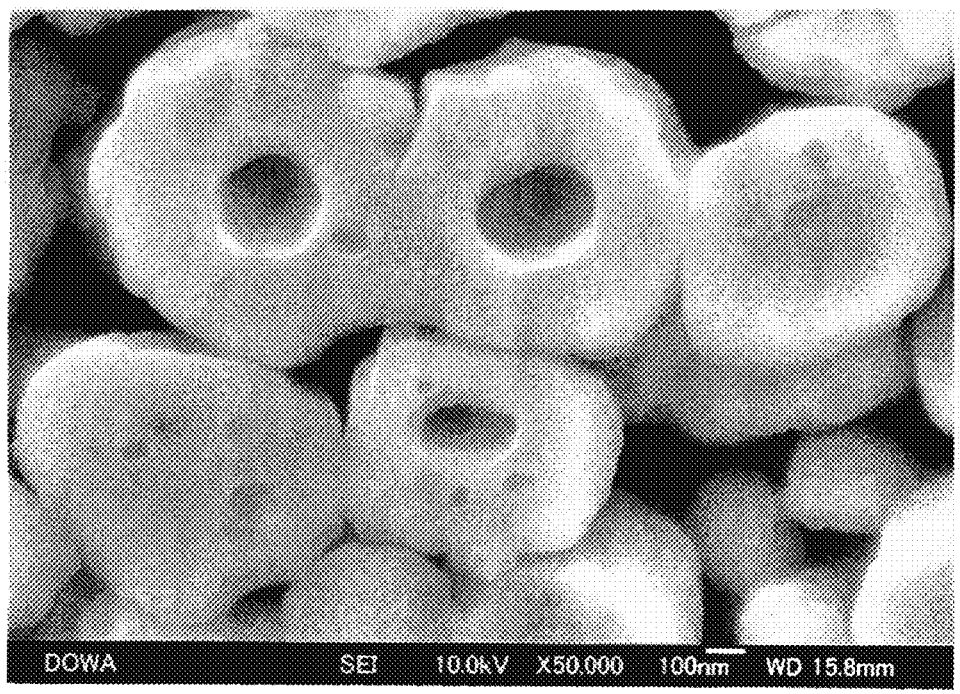
FIG. 3 is an FE-SEM image of a cross section of a spherical silver powder obtained in Example 3.

In the observation of the cross section of the particles of the spherical silver powder, it was confirmed that closed cavities exist in the particles of the spherical silver powder as shown in the FE-SEM image of FIG. 3. The area of all particles of the spherical silver powder on the FE-SEM image was 2.08 μm², and the area of particles having the closed cavities was 0.21 μm², so that the percentage of the area of particles having the closed cavities with respect to the area of all particles of the spherical silver powder was 10%. Considering that it is not always that the cross section of the observed particles of the spherical silver powder passes through the center of each of the particles, it is considered that the cavities exist in most of the particles of the spherical silver powder. It was also confirmed that the mean cavity size obtained by the FE-SEM image is 0.11 μm which corresponds to 8.5% with respect to the mean particle size $D_{50}$ and which is a sufficient cavity size.

With respect to the content of each of the impurity elements in the spherical silver powder, it was confirmed that Cr=1 ppm, Mn<1 ppm, Fe=8 ppm, Co<5 ppm, Ni<5 ppm, Cu<1 ppm, Zn<5 ppm, Cd<1 ppm, Pb<5 ppm, Sn<10 ppm, Ca<1 ppm, Mg<1 ppm, S<50 ppm, Zr<1 ppm, Bi<10 ppm, Al<10 ppm, Sr<1 ppm, Ba<1 ppm, Li<100 ppm, Na<100 ppm, K<100 ppm, Rb<100 ppm and Cs<100 ppm, so that the content of each of the impurity elements was less than 100 ppm. The content of silver in the spherical silver powder was 99.00 wt %. The contents of carbon, nitrogen, oxygen and hydrogen were 3700 ppm, 575 ppm, 3955 ppm and 1300 ppm, respectively.

The spherical silver powder thus obtained was used for preparing a conductive film from a conductive paste by the same methods as those in Example 1, and the volume resistivity thereof was derived by the same method as that in Example 1. As a result, the volume resistivity of the conductive film fired at 400° C. was $4.5 \times 10^{-6}$ Ω·cm, and the volume resistivity of the conductive film fired at 700° C. was $2.3 \times 10^{-6}$ Ω·cm. Thus, the conductivity in an order of $10^{-6}$ Ω·cm was ensured even if the conductive film was obtained by firing at 400° C.

Comparative Example 1

First, 28.6 g of an aqueous silver nitrate solution containing 8.63 g of silver was distributed into a 1 L beaker. Then, the beaker was put in an ultrasonic washing machine (Cleaner USD-4R produced by AS ONE CORPORATION, Output 160 W) containing water having a temperature of 35° C. therein. Then, the solution in the beaker was started to be irradiated with ultrasonic waves at an oscillating frequency of 40 kHz, and to be stirred.

Then, 52.7 g of an aqueous solution containing 28 wt % of ammonia (the equivalent thereof corresponding to 5.0 with respect to silver) was added to the aqueous silver nitrate solution in the beaker to form a silver ammine complex. After 5 minutes from the addition of the aqueous ammonia, 2.2 g of an aqueous solution containing 0.40 wt % of polyethylene imine (having a molecular weight of 10,000) was added thereto. After 20 minutes from the addition of the aqueous ammonia, 19.4 g of an aqueous solution containing 6.2 wt % of hydrazine hydrate (the equivalent thereof corresponding to 1.2 with respect to silver) was added thereto. After 30 seconds from the addition of the aqueous solution of hydrazine hydrate, 0.77 g of a solution containing 1.3 wt % of stearic acid was added thereto to form a slurry containing silver particles. Furthermore, in this comparative example, polyethylene imine was added for adjusting the particle size which was decreased by the use of hydrazine.

Then, after the irradiation with ultrasonic waves was completed, the slurry containing silver particles was filtrated and washed with water. The cake thus obtained was dried at 75° C. for 10 hours by means of a vacuum drier. The silver powder thus dried was crushed for 30 seconds by means of a coffee mill to obtain a spherical silver powder.

With respect to the spherical silver powder thus obtained, the particle size distribution based on the laser diffraction method, BET specific surface area and true specific gravity thereof were measured by the same methods as those in Example 1, and the cross section of particles thereof was observed by the same method as that in Example 1. In addition, the contents of impurity elements, silver and organic components (carbon, nitrogen, oxygen and hydrogen) were obtained by the same methods as those in Example 1.

As a result, the particle size distribution was $D_{10}$=1.8 μm, $D_{50}$=2.9 μm and $D_{90}$=4.4 μm, and the BET specific surface area was 0.16 m²/g. The true specific gravity was 10.3 g/cm³, so that it was confirmed that the true specific gravity was decreased by only 2% with respect to the true specific gravity of bulk silver being 10.5 g/cm³.

Figure 4:
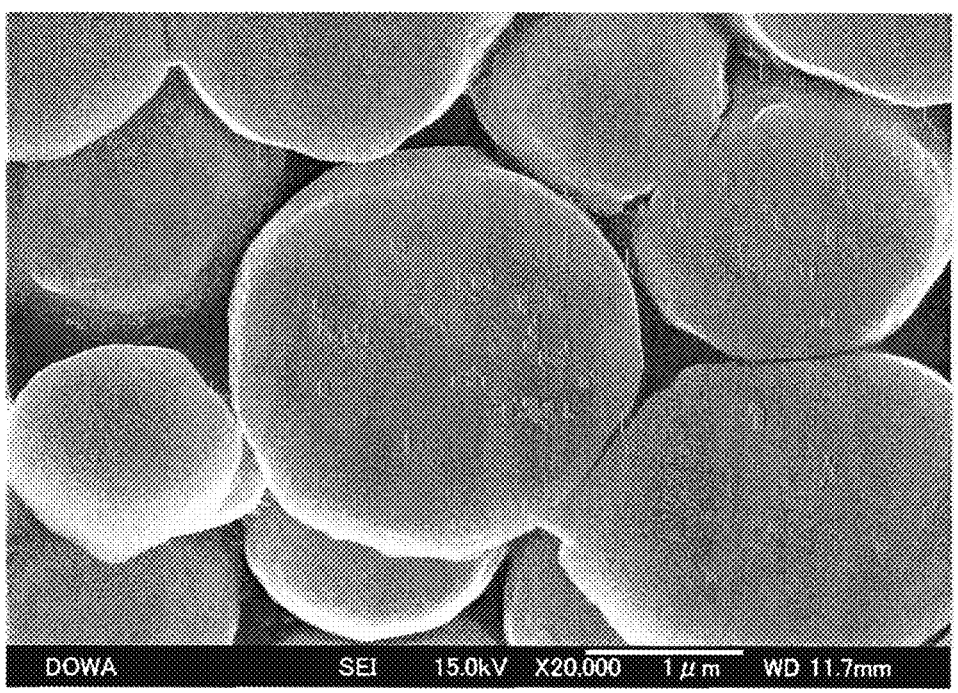
FIG. 4 is an FE-SEM image of a cross section of a spherical silver powder obtained in Comparative Example 1.

In the observation of the cross section of the particles of the spherical silver powder, it was confirmed that no closed cavities exist in the particles of the spherical silver powder as shown in the FE-SEM image of FIG. 4.

With respect to the content of each of the impurity elements in the spherical silver powder, it was confirmed that Cr=1 ppm, Mn<1 ppm, Fe=7 ppm, Co<5 ppm, Ni<5 ppm, Cu<2 ppm, Zn<5 ppm, Cd<1 ppm, Pb<5 ppm, Sn<10 ppm, Ca<1 ppm, Mg<1 ppm, S<50 ppm, Zr<1 ppm, Bi<10 ppm, Al<10 ppm, Sr<1 ppm, Ba<1 ppm, Li<100 ppm, Na<100 ppm, K<100 ppm, Rb<100 ppm and Cs<100 ppm, so that the content of each of the impurity elements was less than 100 ppm. The content of silver in the spherical silver powder was 99.80 wt %. The contents of carbon, nitrogen, oxygen and hydrogen were 900 ppm, 70 ppm, 320 ppm and 200 ppm, respectively.

The spherical silver powder thus obtained was used for preparing a conductive film from a conductive paste by the same methods as those in Example 1, and the volume resistivity thereof was derived by the same method as that in Example 1. As a result, the volume resistivity of the conductive film fired at 400° C. was $1.1 \times 10^{-5}$ Ω·cm, and the volume resistivity of the conductive film fired at 700° C. was $3.0 \times 10^{-6}$ Ω·cm. Thus, the volume resistivity of the conductive film fired at 400° C. was in an order of $10^{-5}$ Ω·cm, so that the conductivity was inferior to that in Examples 1 through 3.

With respect to the spherical silver powder obtained in each of these examples and comparative examples, the particle size distribution based on the laser diffraction method, BET specific surface area and true specific gravity thereof are shown in Table 1, and the results of the observation of the cross section of particles thereof are shown in Table 2. In addition, the volume resistivity of the conductive film obtained in each of these examples and comparative examples is shown in Table 3.

TABLE 1

|  | Particle Size Distribution | | | Specific Surface | True Specific |
| --- | --- | --- | --- | --- | --- |
|  | $D_{10}$ (μm) | $D_{50}$ (μm) | $D_{90}$ (μm) | Area (m²/g) | Gravity (g/cm³) |
| Example 1 | 1.6 | 3.0 | 5.3 | 0.35 | 9.6 |
| Example 2 | 1.5 | 2.8 | 4.5 | 0.36 | 9.7 |
| Example 3 | 0.7 | 1.3 | 2.4 | 0.77 | 9.3 |
| Comp. 1 | 1.8 | 2.9 | 4.4 | 0.16 | 10.3 |

TABLE 2

| | SEM Image | | | |
|---|---|---|---|---|
| | Cross-Sectional Area of Particles ($\mu m^2$) | Cross-Sectional Area of Cavities ($\mu m^2$) | Area Ratio (%) | Mean Cavity Size ($\mu m$) |
| Example 1 | 13.7 | 0.56 | 4.1 | 0.07 |
| Example 2 | 11.8 | 0.34 | 2.9 | 0.05 |
| Example 3 | 2.08 | 0.21 | 10 | 0.11 |
| Comp. 1 | — | 0 | 0 | — |

TABLE 3

| | Volume Resistivity ($\Omega \cdot cm$) | |
|---|---|---|
| | 400° C. | 700° C. |
| Example 1 | $5.2 \times 10^{-6}$ | $2.6 \times 10^{-6}$ |
| Example 2 | $5.7 \times 10^{-6}$ | $2.4 \times 10^{-6}$ |
| Example 3 | $4.5 \times 10^{-6}$ | $2.3 \times 10^{-6}$ |
| Comp. 1 | $1.1 \times 10^{-5}$ | $3.0 \times 10^{-6}$ |

As can be seen from these examples and comparative examples, if silver particles are deposited by reduction by mixing a reducing agent containing solution, which contains an aldehyde, while causing cavitation in a water reaction system containing silver ions, it is possible to produce a spherical silver powder having closed cavities in the particles thereof.

Since a spherical silver powder according to the present invention has closed cavities in the particles thereof, the spherical silver powder can be utilized for preparing a conductive paste as a spherical silver powder which has a particle size being substantially equal to that of a spherical silver powder produced by a conventional wet reducing method and which is capable of being fired at a lower temperature.

The invention claimed is:

1. A spherical silver powder comprising spherical silver particles having a mean particle size $D_{50}$ of 1.3 to 3.0 $\mu m$ and a particle size $D_{90}$ of 2.4 to 5.3 $\mu m$, the content of silver in the spherical silver particles being 99.0 wt % or more, each of the spherical silver particles having a plurality of closed cavities,
wherein said spherical silver powder has a true specific gravity of not greater than 9.8 g/cm$^3$, and
wherein said spherical silver particles contain carbon, nitrogen, oxygen, hydrogen, and unavoidable impurities which contain Cr, Mn, Fe, Co, Ni, Cu, Zn, Cd, Pb, Sn, Ca, Mg, S, Zr, Bi, Al, Sr, Ba, Li, Na, K, Rb and Cs, the content of each of the unavoidable impurities being less than 100 ppm.

2. A spherical silver powder as set forth in claim 1, wherein said true specific gravity is in the range of from 9.3 g/cm$^3$ to 9.8 g/cm$^3$.

3. A spherical silver powder as set forth in claim 1, wherein said closed cavities have a mean cavity size of 0.05 to 0.11 $\mu m$.

4. A conductive paste comprising the spherical silver powder as set forth in claim 1.

5. A spherical silver powder comprising spherical silver particles having a mean particle size $D_{50}$ of 1.3 to 3.0 $\mu m$ and a particle size $D_{90}$ of 2.4 to 5.3 $\mu m$, the content of silver in the spherical silver particles being 99.0 wt % or more, each of the spherical silver particles having a plurality of closed cavities,
wherein an area ratio of a cross-sectional area of the closed cavities to a cross-sectional area of the spherical silver particles is 4.1% or less, and
wherein said spherical silver particles contain carbon, nitrogen, oxygen, hydrogen, and unavoidable impurities which contain Cr, Mn, Fe, Co, Ni, Cu, Zn, Cd, Pb, Sn, Ca, Mg, S, Zr, Bi, Al, Sr, Ba, Li, Na, K, Rb and Cs, the content of each of the unavoidable impurities being less than 100 ppm.

6. A spherical silver powder as set forth in claim 5, wherein said closed cavities have a mean cavity size of 0.05 to 0.11 $\mu m$.

7. A spherical silver powder comprising spherical silver particles having a mean particle size $D_{50}$ of 1.3 to 3.0 $\mu m$ and a particle size $D_{90}$ of 2.4 to 5.3 $\mu m$, the content of silver in the spherical silver particles being 99.0 wt % or more, each of the spherical silver particles having a plurality of closed cavities, and
wherein said spherical silver particles contain carbon, nitrogen, oxygen, hydrogen, and unavoidable impurities which contain Cr, Mn, Fe, Co, Ni, Cu, Zn, Cd, Pb, Sn, Ca, Mg, S, Zr, Bi, Al, Sr, Ba, Li, Na, K, Rb and Cs, the content of each of the unavoidable impurities being less than 100 ppm.

8. A spherical silver powder as set forth in claim 7, wherein said closed cavities have a mean cavity size of 0.05 to 0.11 $\mu m$.

9. A spherical silver powder comprising spherical silver particles having a mean particle size $D_{50}$ of 1.3 to 3.0 $\mu m$ and a particle size $D_{90}$ of 2.4 to 5.3 $\mu m$, the content of silver in the spherical silver particles being 99.0 wt % or more, each of the spherical silver particles having a plurality of closed cavities which have a mean cavity size of 0.05 to 0.11 $\mu m$,
wherein said spherical silver powder has a true specific gravity of from 9.3 g/cm$^3$ to 9.8 g/cm$^3$, and
wherein an area ratio of a cross-sectional area of the closed cavities to a cross-sectional area of the spherical silver particles is 4.1% or less.

10. A spherical silver powder comprising spherical silver particles having a mean particle size $D_{50}$ of 1.3 to 3.0 $\mu m$ and a particle size $D_{90}$ of 2.4 to 5.3 $\mu m$, the content of silver in the spherical silver particles being 99.0 wt % or more, each of the spherical silver particles having a plurality of closed cavities and
wherein said spherical silver particles contain 1700 to 3700 ppm of carbon, 575 to 1710 ppm of nitrogen, 3020 to 3955 ppm of oxygen, and 650 to 1300 ppm of hydrogen.

* * * * *